United States Patent [19]

Gantois

[11] Patent Number: 5,139,584
[45] Date of Patent: Aug. 18, 1992

[54] CARBURIZATION PROCESS

[75] Inventor: Michel Gantois, Nancy, France

[73] Assignee: Solo Fours Industriels SA, Biel, Switzerland

[21] Appl. No.: 549,968

[22] Filed: Jul. 9, 1990

[30] Foreign Application Priority Data

Jul. 13, 1989 [CH] Switzerland ......................... 2632/89
Dec. 14, 1989 [FR] France ................................ 89 16541

[51] Int. Cl.$^5$ ........................... C21D 1/76; C23C 8/22
[52] U.S. Cl. .................................................. 148/235
[58] Field of Search .................. 148/16.5, 128, 16.16.7

[56] References Cited

U.S. PATENT DOCUMENTS

| | | | |
|---|---|---|---|
| 4,415,379 | 11/1983 | Stanescu et al. | 148/16.5 |
| 4,869,756 | 9/1989 | Schwing et al. | 148/16 |
| 4,881,982 | 11/1989 | Edenhofer et al. | 148/16.5 |

FOREIGN PATENT DOCUMENTS

| | | |
|---|---|---|
| 90401 | 12/1985 | Australia . |
| 3139622 | 4/1983 | Fed. Rep. of Germany . |
| 3507527 | 5/1986 | Fed. Rep. of Germany . |

OTHER PUBLICATIONS

Haerterei Technische Mitteilungen, vol. 31, No. 3, 1976, pp. 132–137, J. Wunning et al., "Gesteuerte Aufkohlung in CO-freien Atmospharen".

Primary Examiner—H. Dean
Assistant Examiner—Margery S. Phipps
Attorney, Agent, or Firm—Oliff & Berridge

[57] ABSTRACT

A process and an installation for heat treatment or thermochemical treatment of steel permit instantaneous and permanent checking of the concentration of carbon at the surface of the steel, particularly in the course of the carbon enrichment of the surface zone of a workpiece. The process provides for the circulation in contact with this surface zone of a gaseous flux permitting the saturation concentration of carbon at the surface to be obtained at maximum speed, and for regulating this flux as a function of time. The installation comprises a monitored-atmosphere furnace having an input and an outlet for a gaseous flux, feed means forming this gaseous flux, and means for regulating the gaseous flux; it is equipped with data-storage and/or calculating means, and the feed means are designed to form a gaseous flux suitable for obtaining a saturation concentration of carbon at the surface of the workpieces in less than one minute.

3 Claims, 6 Drawing Sheets

CARBURIZATION PROCESS

This invention relates to the carburization of steel, and more particularly to a process for heat or thermochemical treatment of a steel, of the type permitting instantaneous and continuous checking of the concentration of carbon at the surface of the steel, especially in the course of the carbon enrichment of the surface zone of a workpiece.

The invention further relates to an installation for carbon enrichment of the surface zone of steel workpieces, of the type comprising a monitored-atmosphere furnace having an input and an outlet for a gaseous flux, feed means forming this gaseous flux, and means for regulating the gaseous flux.

The checking of the concentration of carbon at the surface of steel in the course of a heat treatment or of a thermochemical treatment while avoiding undesirable complementary reactions, such as oxidation, for example, is a problem of great industrial importance, the solution of which calls for the implementation of multiple technological solutions.

In the case of heat treatment, the solution chosen for highly alloyed steels, sensitive to oxidation, calls for vacuum technologies. In the case of thermochemical treatments, of cementation or case-hardening, for example, a gas-solid or liquid-solid reaction is utilized. Chemical species present in the gaseous phase or in the liquid phase decompose at the surface of the steel, releasing the carbon, which diffuses into the solid.

In vacuum heat-treatment processes, the oxidation and the decarburization of the steel are avoided by maintaining a very low total pressure of the atmosphere of the furnace (less than 0.1 mb).

In the best-monitored case-hardening processes, the steel is placed in contact with an atmosphere in thermodynamic equilibrium, the feed of which is sufficiently high so that the equilibrium is not appreciably modified by the transfer of the carbon into the solid. In this case, the chemical species of the gaseous phase which serves as a support for the carbon is carbon monoxide (CO). Its decomposition at the surface of the steel releases oxygen, the partial pressure of which must be kept very low.

The problem of the case-hardening of steel will now be analyzed in detail.

The rates of cementation, i.e., the conditions for obtaining the profile of carbon concentration in the shortest possible time, depend upon the rates of transfer of the chemical species in the liquid phase or in the gaseous phase (e.g., carbon monoxide in the gaseous phase), the rates of transfer of the carbon at the liquid-solid or gas-solid interface, and the diffusion of carbon in the solid phase.

In the conventional processes, the limiting stage is that corresponding to the transfer of the carbon to the interface, either because the decomposition reaction of the chemical species is slow or because the decomposition products of these species cause a resistance to the transfer of the carbon at the surface of the steel.

Thus, for the conventional processes of case-hardening in the gaseous phase by carbon monoxide, the elimination of the oxygen is too low, which greatly reduces the flux of carbon transferred. This is shown in that the surface concentration of carbon does not reach the maximum value, permitting the diffusion of the carbon into the solid at the optimum rate, until quite some time, e.g., 20 min., after having been put in contact with the appropriate atmosphere in the usual conditions of temperature and pressure.

There is disclosed particularly in an article by J. Wünning et al., entitled "Gesteuerte Aufkohlung," published in HTM 31, 1976 3, as well as in German Patent No. 3,139,622, a process according to which certain parameters are measured during the carbon-enrichment phase and serve, after processing, for determining operational data of the installation.

However, the teaching contained in these references does not permit conducting a carbon-enrichment process practically in the minimum possible time. Furthermore, the prior art process takes place at reduced pressure.

The research which led to the present invention came to the following findings:

In order for the transitory conditions to be as brief as possible, the carbon flux transferred via the gaseous phase and to the gas-solid interface must be greater than, then equal to, the carbon flux transferred in the solid phase by diffusion for a maximum carbon surface concentration. For that purpose, there must be:

- a carbon-vector chemical compound in the gaseous phase having very rapid decomposition kinetics at the surface of the steel,
- a reactor having thoroughly agitated reactor behavior,
- a gas-solid reaction permitting any formation of a transfer resistance at the surface of the steel to be avoided.

Such transfer resistance may consist either of a layer of adsorbed chemical elements resulting from the decomposition of the carbon-vector chemical species, or of the formation of a continuous layer of a specific compound (carbide) in which the diffusion of the carbon is slow.

If the appearance of this transfer resistance is avoided, if the decomposition at the surface of the steel of the molecule ensuring the transfer of the carbon in the gaseous phase is very rapid, if the feed of carbon at the input of the reactor is sufficient, and if the reactor is thoroughly agitated, there is a maximum flux of carbon transferred into the steel, and the rate of elaboration of the gradient of carbon concentration in the steel depends only on the diffusion of the carbon in the solid state.

When these conditions are satisfied, the surface carbon concentration of a steel initially having a carbon concentration of 0.2% reaches its optimum value (a value at least equal to the saturation concentration of the austenite) in less than one minute, a period of time to be compared with the dozens of minutes necessary in the case of a conventional case-hardening process by carbon monoxide.

The treatment of cementation by the carbon is effected in this case at an optimum rate of speed.

It is therefore an object of this invention to define practical means permitting this result to be achieved industrially.

To this end, in the process according the present invention, of the type initially mentioned, there is caused to circulate in contact with the surface zone a gaseous flux permitting the saturation concentration of carbon at the surface to be obtained at maximum speed, and this flux is regulated as a function of time.

The installation according to the present invention, also of the type initially mentioned, is equipped with datastorage and/or calculating means, and in that the feed means are designed to form a gaseous flux suitable for obtaining a saturation concentration of carbon at the surface of the workpieces in less than one minute.

These conditions are achieved by using a gaseous mixture which contains no oxygen, made up of a chemically inert support gas or gaseous mixture, of a gas or a gaseous mixture permitting any oxidation phenomenon to be avoided during the periods of the treatment cycle when the carbon flux at the surface of the workpiece is nil, of a gas or a gaseous mixture permitting the transfer of the carbon and made up of compounds free of oxygen. The gas or the gaseous mixture permitting the transfer of the carbon contains at least one chemical compound, the pyrolysis of which at the surface of the steel releases carbon and leads to the formation of a mixture of chemically stable by-products in the gaseous phase, in the conditions of temperature and of pressure considered. Thus, the flux of carbon transferred can be controlled by the feed of the pyrolysable compound introduced into the reactor.

A preferred practical embodiment of the invention will now be described in detail with reference to the accompanying drawings, in which.

In practice, the treatment may be carried out in the following manner:

a first phase (I) at the maximum possible temperature, defined on the basis of metallurgical criteria, with control of the input feed of hydrocarbons for obtaining a maximum concentration of surface carbon, this maximum concentration being at least equal to the carbon saturation concentration of the austenite;

a second phase (II) at the maximum possible temperature, defined on the basis of metallurgical criteria, during which the flux of carbon transferred from the gaseous phase is nil in order to adjust the carbon concentration profile and, in particular, the surface concentration, to a predetermined value chosen for metallurgical reasons. In numerous cases, this value is close to 0.7/0.8% on conventional case-hardened steels.

At the end of this second phase, the temperature may be that chosen for carrying out tempering of the steel.

It is possible to carry out a cycle by an appropriate succession of phases I and phases II, the number and duration of which depend upon the desired carbon concentration profile. In this case, however, the total duration of the cycle will be longer than in the case of a cycle comprising only one phase I and one phase II.

Phase I necessitates precise checking of the surface concentration of carbon based on the carbon flux consumed by the steel. This carbon flux is in turn monitored by the feed of hydrocarbons introduced into the reactor. If the concentration of carbon at the surface of the steel is known, the rate of carbon consumed is easily calculated. Conversely, continuous checking of the rate of carbon consumed permits maintenance of a constant surface carbon concentration. The rate of carbon consumed is obtained by drawing up the material balance-sheet of the reactor, either after preliminary identification of the different chemical species formed, as well as the evolution of their concentration, or by an analysis at each moment of the gaseous mixture leaving the reactor. The second solution avoids uncertainties of a physicochemical model, and it permits checking the operation of the reactor and the evolution of the gas-solid reaction at each moment.

Flawless monitoring of the carbon surface concentration during phase I is indispensable for an accurate knowledge of the profile of carbon concentration in the steel at the end of this phase. Indeed, it is on the basis of this profile that the duration of phase II will be determined for obtaining, at the end thereof, the final carbon concentration profile desired for metallurgical reasons (profile of microhardness—concentration of surface compression constraints—residual austenite content).

As indicated above, monitoring of the carbon surface concentration of the steel at a constant value may be obtained by controlling the input feed of the hydrocarbon into the reactor on the basis of a carbon balance-sheet drawn up for the reactor acting as a thoroughly agitated reactor. It is necessary, however, to determine with sufficient accuracy the moment when this maximum surface concentration is reached at the end of the transitory period which appears at the beginning of the treatment.

An elegant solution to this problem consists in forming a layer of iron carbide (called cementite) at the surface of the steel from the beginning of the diffusion of the carbon by introducing into the support mixture (nitrogen-hydrogen, for example) a suitable proportion of a mixture of hydrocarbons, such as acetylene, methane, ethylene, ethane. This mixture permits the very rapid growth of a thin layer of cementite at the surface of the steel. This thin layer, which is 1 micrometer thick, fixes the concentration of carbon at the cementite-steel interface at the exact value of the saturation concentration of the carbon in the austenite at the temperature considered. The diffusion of the carbon in the steel is therefore monitored by the existence of this layer of cementite. It is this which supplies the carbon that diffuses in the steel. It suffices for the carbon consumed by the steel to be compensated for by the reconstitution of the layer of cementite which is fed with carbon from the hydrocarbons of the gaseous phase.

This process, which leads at the beginning of the treatment to the very rapid formation (less than one minute) of a layer of cementite, permits a self-monitored diffusion of the carbon.

The composition of the gaseous mixture which permits the rapid growth of the layer of cementite may be produced by a suitable addition of a single hydrocarbon, propane, the decomposition of which upon contact with the steel permits the desired gaseous mixture to be obtained, containing particularly and non-exclusively methane, ethane, ethylene, and acetylene.

Once the layer of cementite has been formed, its feed of carbon is permanently regulated so that it compensates for the carbon consumed by the steel. Dynamic transfer conditions are thus established between the gaseous phase, the layer of cementite, and the steel.

Under these conditions, for a given steel, the temperature is the only parameter which monitors the transfer of the carbon into the steel.

The adjustment of the final carbon concentration profile may necessitate the partial transfer of the carbon from the solid to the gaseous phase during phase II. For this purpose, the gaseous mixture must contain a constituent capable of combining with the carbon to form hydrocarbons, thus ensuring that the gaseous mixture has a decarburizing function.

The gaseous support mixture must therefore ensure three functions:

avoid any oxidation during all the phases where the flux of carbon from the gaseous mixture to the solid is nil;

form, with the products of decomposition of the hydrocarbon introduced during the cementation proper, a mixture chemically capable of forming a layer of cementite permitting the transfer of the carbon into the steel to be ensured;

possibly ensure, after phase I, a function of partial decarburization of the surface of the steel.

These three functions may be obtained by using a gaseous support made up of a suitable mixture of nitrogen and hydrogen.

The principles set forth above can be demonstrated quantitatively with the aid of thermogravimetric measurements with automatic treatment of the measurements and automatic control of the gaseous feeds.

Figure 2:
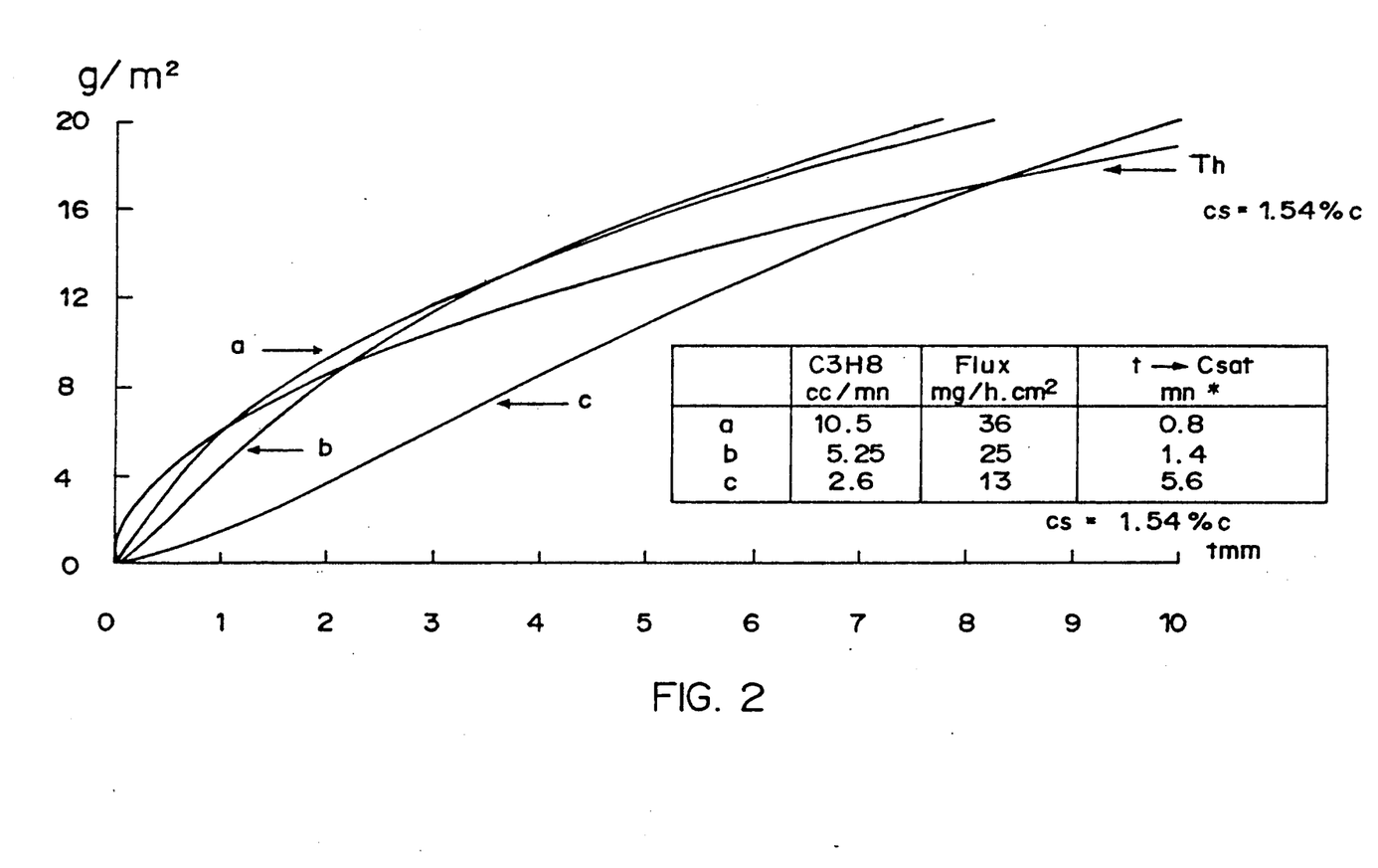
FIG. 2 is a comparative graph of carbon enrichment carried out according to different methods.

It is found, for example, that the fluxes may be regulated at will, either at a constant value (curves a, b, c of FIG. 2) or by causing them to vary, so that the carbon surface concentration is constant (curve Th, FIG. 2).

Table I gives the instantaneous fluxes and the average fluxes for surface concentrations equal to the saturation concentration of the austenite. These fluxes are to be compared with those obtained in the course of conventional carbon monoxide treatments which reach 3.5 mg/hr·sq.cm. at about 950° C.

Figure 3:
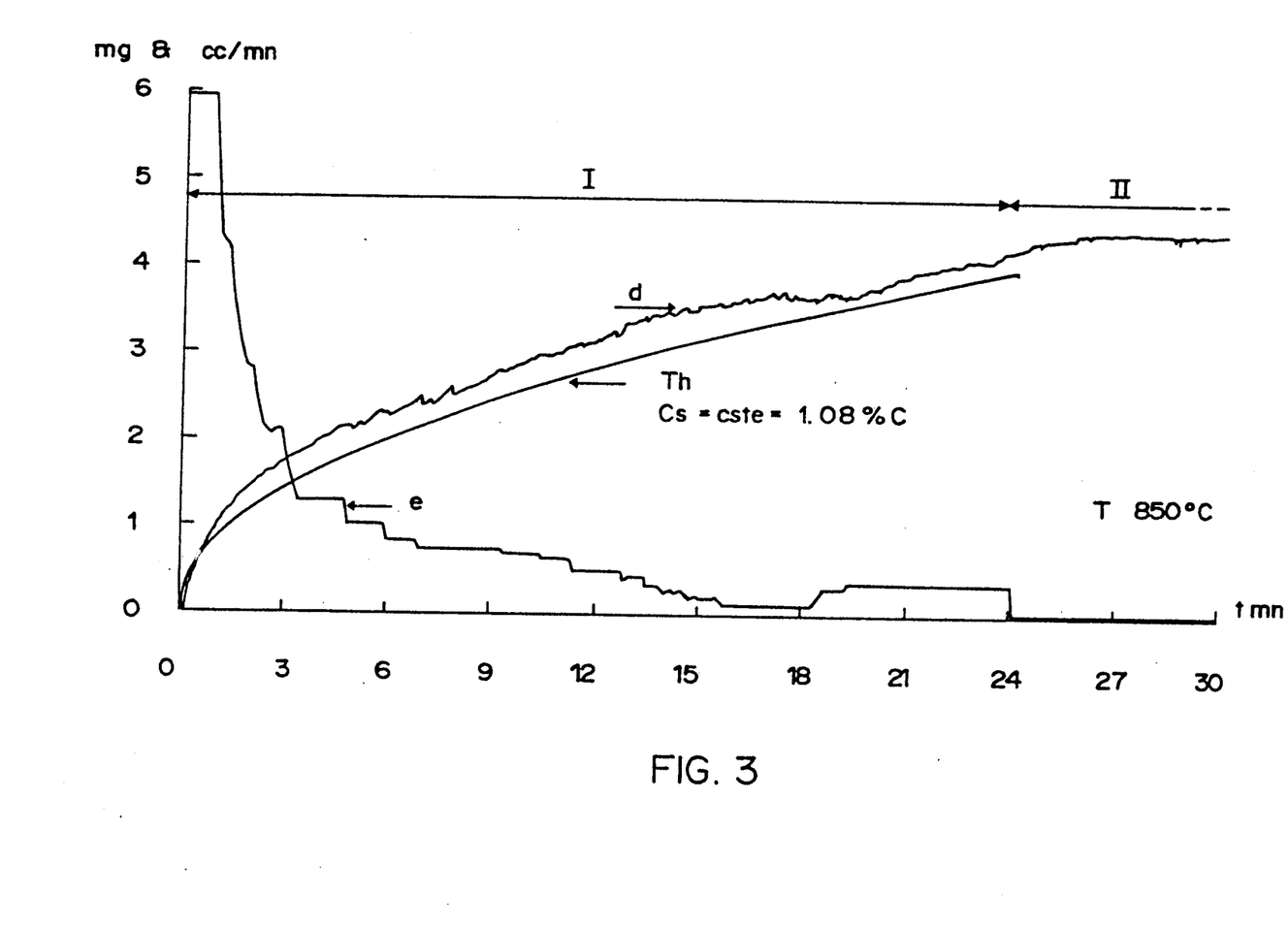
FIGS. 3 and 5 are graphs illustrating embodiments of implementation of the process at two different temperatures.

It is found on the curve of FIG. 3, corresponding to case-hardening at 850° C., that the algorithm for controlling the feed of propane permits an absorption of carbon at constant surface concentration to be produced from the very first moments of the treatment. In fact, whatever the temperature between 800° C. and 1100° C., the conditions of Dirichlet (constant concentration at the surface) are reached in less than one minute, whereas case-hardening by carbon monoxide necessitates quite some time (usually about one hour for the surface concentrations greater than 1% of carbon beyond 900° C.).

Figure 1:
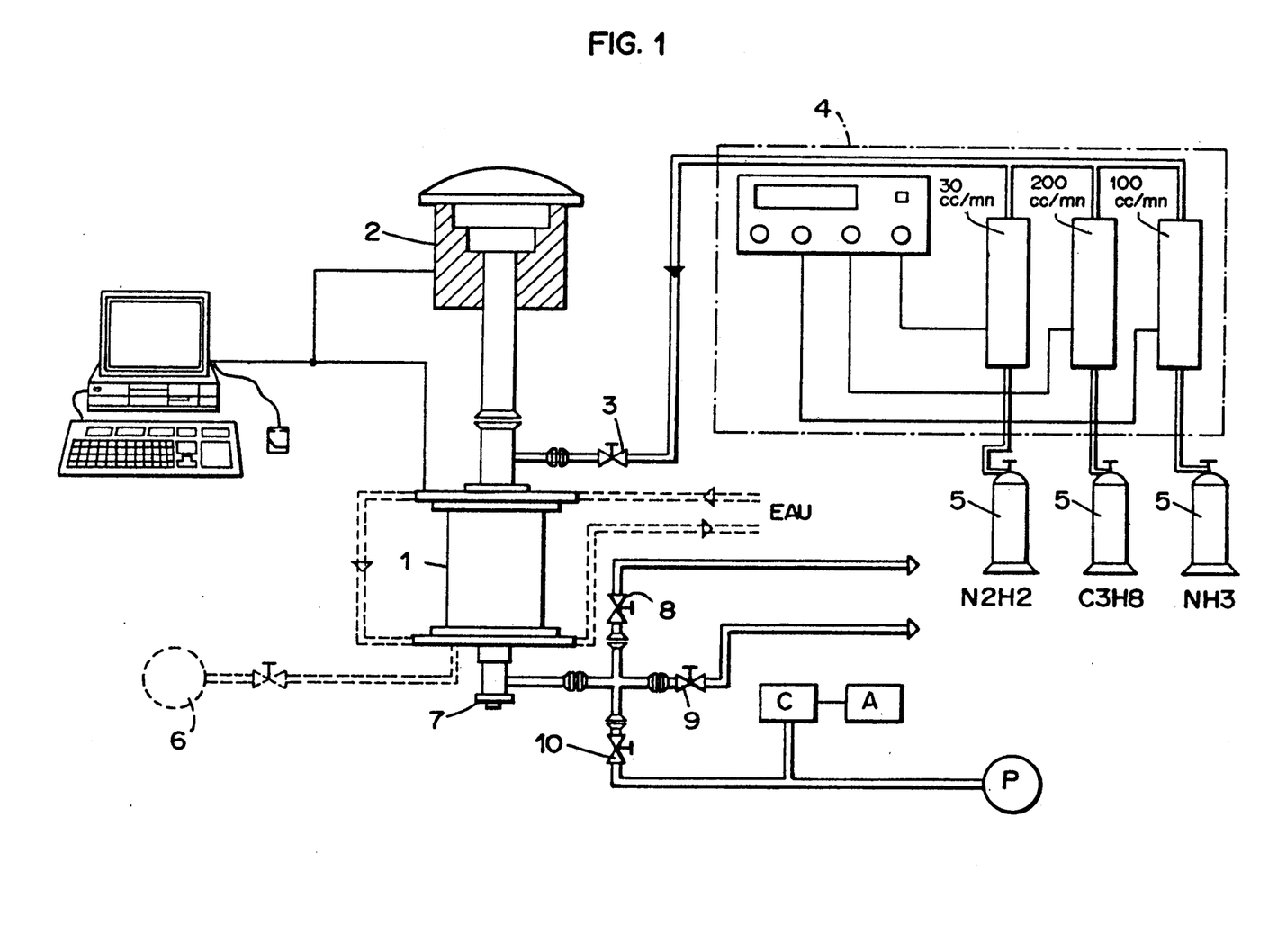
FIG. 1 is an elevation of an installation for developing the basic data of the implementation of the process.

FIG. 1 shows schematically measurement means for gathering the data necessary for controlling a treatment. An assembly 1 made up of a furnace of an analysis chamber is associated with a scale 2. Through a valve 3, the furnace is fed from a mass flow regulator 4 with gases contained in bottles 5, in the present case three of them. A pump 6 ensures the circulation of the gas and maintains the pressure in the furnace. A thermocouple 7 monitors the temperature. Gas outlets 8, 9, and 10 permit the gases to be exhausted, the outlet 9 being connected to a chromatographic analysis apparatus, and the outlet 10 to a pressure sensor C and a pump P. A feed is possible at A. This installation permits drawing up the material balance-sheet of the reactor, either by identification of the chemical species formed and detection of the evolution of their concentration, or by continuous analysis of the gaseous mixture leaving the reactor.

The curves of FIG. 2, which correspond to certain particular cases, give the quantities of carbon, in grams per square meter, which have penetrated into the surface of the steel, as a function of the time of exposure. The curves a, b, and c correspond to different operating conditions, all comprising the sweeping of the steel at 1000° C. by a gaseous flux in which the rate of flow of the support gas is 100 cc/min. The curve Th (theoretical curve) gives the quantities of carbon which have penetrated into the steel at the time t under comparable conditions when there is imposed upon the gaseous flux the condition that its flow is constantly such that it maintains the carbon surface concentration at a constant value of cs=1.54%, which value corresponds to saturation.

The time needed to reach saturation in each of the conditions defined for the flux by the curves a, b, and c are 0.8, 1.4, and 5.6 min., respectively.

The curves of FIG. 3 illustrate one embodiment of the process of the invention. Workpieces of a predetermined size are placed in a furnace at 850° C. The curve Th gives, as in FIG. 2, the quantities of carbon which, according to the calculation, have penetrated into the steel as a function of time, if the condition of surface concentration equal to saturation is continuously maintained. The curve d reproduces a recording actually made during running of the process, while the curve e gives, as a function of time, the rates of flow of propane in the gaseous mixture as they have been obtained by the control of the operation. These rates are given in cc/min. The curve d is a consequence of the curve e.

The enrichment phase ends after 24 min. The value of the carbon content corresponding to saturation is cs=1.08%. During the diffusion phase, which follows the enrichment, the feed of propane is reduced to zero. The quantity of carbon which penetrates into the steel first remains constant, then decreases.

It is seen that the curve d is situated slightly above the curve Th as soon as saturation has been obtained, i.e., after less than one minute. The rapid formation of a thin layer of cementite, which regulates the diffusion of the carbon in depth, is thus brought about.

Figure 4:
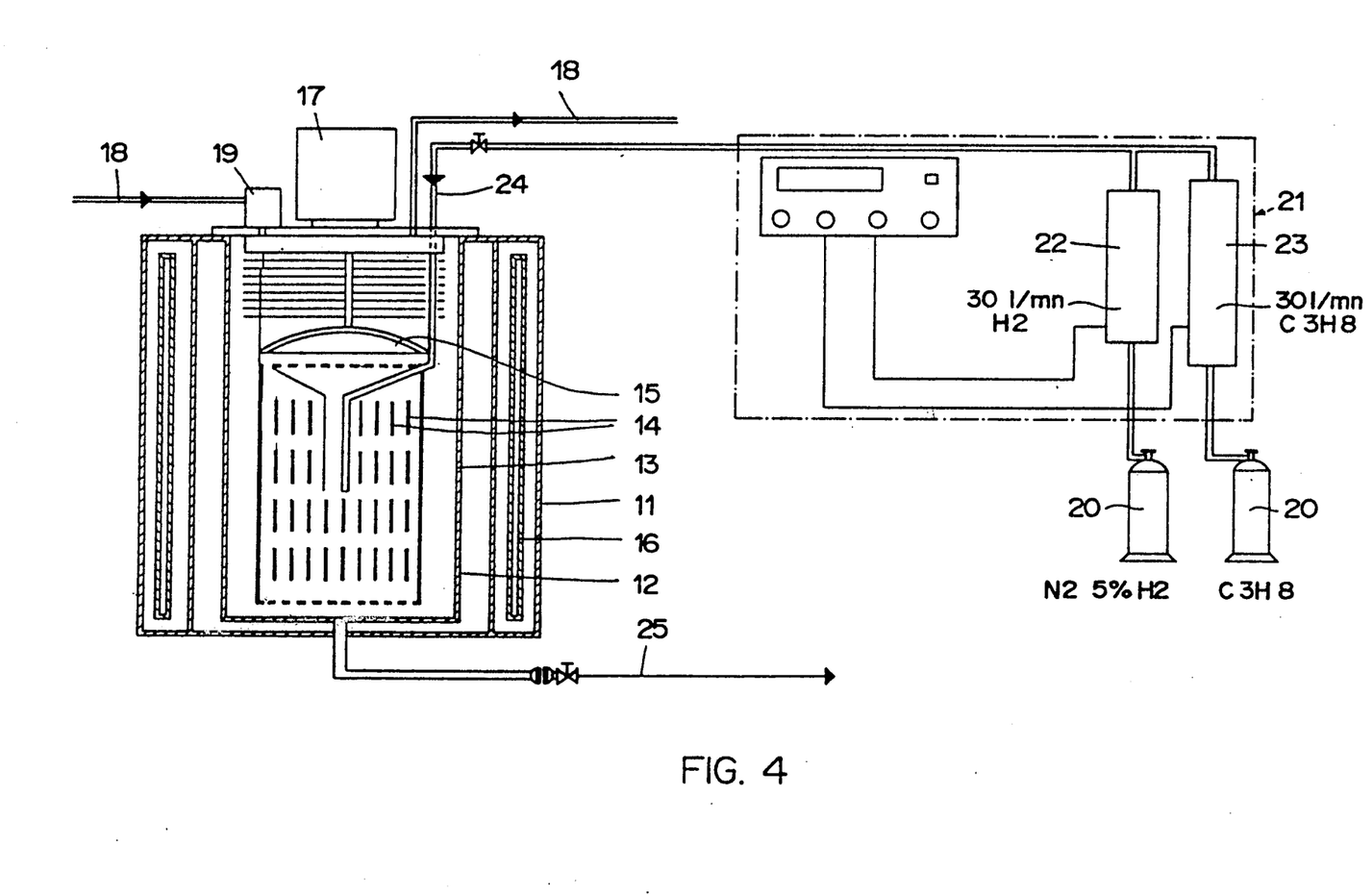
FIG. 4 is a diagrammatic view of an installation for implementing the process.

FIG. 4 shows diagrammatically an installation for carrying out the process in a case where the data for controlling the gaseous mixture have been stored or entered in the regulator in the form of an algorithm.

The furnace 11 comprises a muffle 12, an inner pot 13, a load of workpieces 14, and a turbine 15. It is equipped with heating elements 16, a motor 17, and a cooling-water circuit 18 monitored by a thermocouple 19. The gaseous flux entering at 24 and leaving at 25 is made up of a carrier flux $N_2 + 5\% H_2$ and of a carbon-supplying flux $C_3H_8$. These fluxes come from bottles 20. They can attain a flow of 30 lt/min. As a function of control parameters, valves 22 and 23 separately regulate the rates of flow of the bottles as a function of time. The regulator 21 acts under the effect of data which can have been developed by the equipment of FIG. 1.

Figure 5:
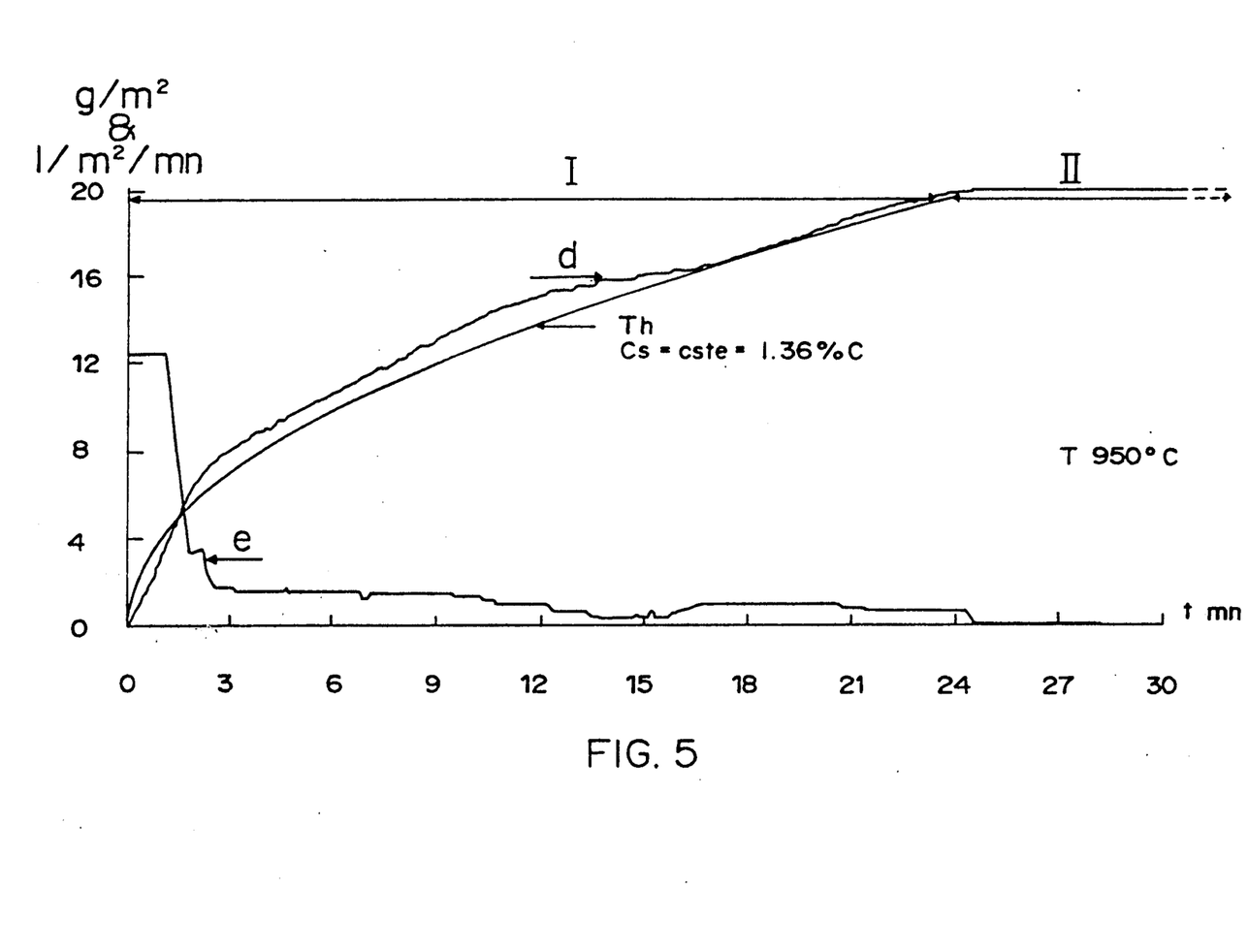
Figure 6:
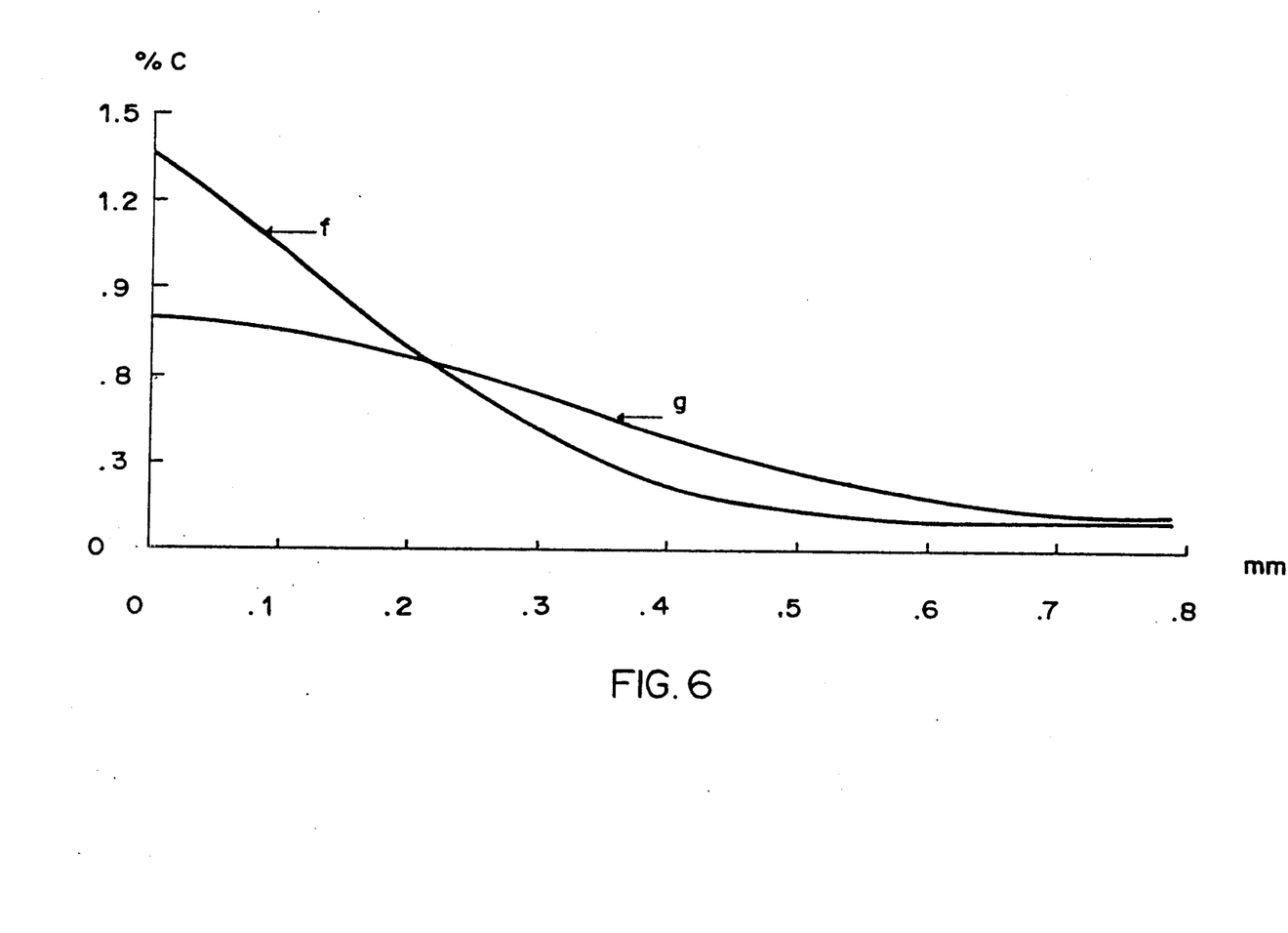
FIG. 6 is an auxiliary graph relating to the embodiment of FIG. 5.

The graphs of FIGS. 5 and 6 relate to another embodiment of the process. The curves Th, d, and e of FIG. 5 have the same meanings as in FIG. 3. The indications on the y-axis are, respectively, masses of carbon having penetrated into the surface of the workpieces, in grams per square meter, and rates of flow of gas in liters per square meter and minute. The first scale relates to curves Th and d, the second to curve e. Case-hardening was carried out at 950° C. The carbon content at saturation is cs=1.36%, which figure determines here the theoretical curve Th.

After an enrichment phase which lasts 24 min., as shown in FIG. 5, the diffusion phase takes place as illustrated in FIG. 6, which is a conventional graph reproducing depth concentration profiles. The curve f gives, in the conditions of the embodiment of FIG. 5, the profile of the carbon concentrations at the end of the enrichment phase, i.e., after 24 min. The curve g is a reading of the profile of the concentrations after 22 min. of diffusion. The carbon content is about 0.8% at the surface and 0.1% at a depth of about 0.62 mm.

FIG. 4 shows the basic diagram of an industrial reactor for carrying out this treatment. Numerous other reactor geometries are compatible with this treatment; the usual apparatus for tempering steel either in a liquid medium (oil, water, etc.) or in a gaseous medium may obviously be added to it.

FIG. 5 gives the recording of a typical treatment conducted at 950° C. with a first phase of 24 min. carried out at a constant surface concentration of 1.38% carbon followed by a diffusion phase permitting a surface concentration of 0.8% carbon to be obtained at the end of the treatment.

FIG. 6 gives the profiles of carbon concentration obtained.

Summing up, the process described presents the following important elements:

I. It permits continuous and instantaneous checking of the flux of carbon transferred to the surface of a steel with the aid of a gaseous atmosphere ensuring the instantaneous and permanent checking of the concentration of carbon at the surface of the steel.

II. It permits, besides the checking of the concentration of carbon at the surface of the steel, the avoidance of any oxidation, even of the most oxidizable alloy elements of the steels. It is applicable to heat treatments of alloy steels, to the carburization sometimes called cementation or case-hardening, and to the carbonitriding of steels.

III. It encompasses a process for accelerated cementation (or carburization) of steels with the aid of a gaseous mixture containing one or more hydrocarbons permitting, under varied pressure conditions and particularly at atmospheric pressure, the monitoring of the flux of carbon absorbed by the steel based on the monitoring of the feed of hydrocarbons injected into the gaseous mixture.

IV. The accelerated case-hardening process permits the carbon surface concentration to be maintained at the highest possible level compatible with the temperature of the steel for obtaining the maximum flux of carbon permitting enrichment of the surface with carbon during the shortest time possible.

V. This accelerated case-hardening process is characterized by a phase of diffusion of the carbon into the steel, in the course of which the carbon flux transferred from the gas to the steel is nil, thus permitting the profile of carbon concentration to be adjusted based on the surface and according to certain metallurgical criteria. In the course of this phase, the fine layer of cementite disappears since it is no longer fed with carbon by the gaseous phase.

VI. It is likewise characterized, if need be, by a phase of diffusion of the carbon into the steel, in the course of which a monitored carbon flux is transferred from the steel to the gaseous phase, thus permitting the carbon concentration profile to be adjusted based on the surface and according to certain metallurgical criteria.

VII. In certain cases, the process permits carrying out the shortest possible treatment in only two phases:
 a phase of enrichment at maximum speed,
 a phase of diffusion.

The process also permits slower running of the treatment leading to the same carbon concentration profile with the aid of several alternating phases of enrichment and diffusion intercombined in different ways.

VIII. It is possible to introduce nitrogen to the surface of the steel simultaneously with the diffusion of the carbon. It suffices to introduce a suitable quantity of ammonia into the mixture. A self-monitored carbonitriding treatment is then achieved at the maximum rate of diffusion of the carbon and of the nitrogen.

IX. Use of a gaseous support mixture permitting oxidation of the steel to be avoided at any of the phases of treatment and made up in particular of a mixture of nitrogen and hydrogen in suitable proportions.

X. Possibility of checking the carbon flux with the aid of the monitoring of the feed of propane introduced into the nitrogen-hydrogen mixture.

XI. The installation for carrying out the process may use all types of batch or continuous furnaces operating at low or high pressure, and particularly at atmospheric pressure, provided that the gaseous atmosphere is thoroughly agitated.

XII. Monitoring of the carbon flux or of the surface concentration of carbon is obtained automatically by the coupled control of the temperature of the steel and the hydrocarbon feed, and particularly of the propane.

An automatically controlled installation permits the case-hardening of steels at maximum speed at atmospheric pressure.

It completely avoids any formation, and hence any rejection, of carbon monoxide and carbon dioxide.

TABLE 1

| | CALCULATION OF INSTANTANEOUS FLUXES AND AVERAGE FLUXES | | | | | |
|---|---|---|---|---|---|---|
| | 1000° C. Csal = 1.54% C | | 950° C. Csal = 1.36% C | | 900° C. Csal = 1.20% C | |
| Time in min. | Flux Mg/h.cm$^2$ | Average flux Mg/h.cm$^2$ | Flux Mg/h.cm$^2$ | Average flux Mg/h.cm$^2$ | Flux Mg/h.cm$^2$ | Average flux Mg/h.cm$^2$ |
| 0.10 | 56.49 | 112.99 | 37.89 | 75.78 | 24.78 | 49.57 |
| 0.30 | 32.62 | 65.23 | 21.88 | 43.75 | 14.31 | 28.62 |
| 0.50 | 25.27 | 50.53 | 16.94 | 33.89 | 11.08 | 22.17 |
| 0.70 | 21.35 | 42.71 | 14.32 | 28.64 | 9.37 | 18.74 |
| 0.90 | 18.83 | 37.66 | 12.63 | 25.26 | 8.26 | 16.52 |
| 1.10 | 17.03 | 34.07 | 11.42 | 22.85 | 7.47 | 14.95 |
| 1.30 | 15.67 | 31.34 | 10.51 | 21.02 | 6.87 | 13.75 |
| 1.50 | 14.59 | 29.17 | 9.78 | 19.57 | 6.40 | 12.80 |
| 1.70 | 13.70 | 27.40 | 9.19 | 18.38 | 6.01 | 12.02 |
| 1.90 | 12.96 | 25.92 | 8.69 | 17.38 | 5.69 | 11.37 |
| 2.10 | 12.33 | 24.66 | 8.27 | 16.54 | 5.41 | 10.02 |
| 2.30 | 11.78 | 23.56 | 7.90 | 15.80 | 5.17 | 10.34 |

TABLE 1-continued

| | CALCULATION OF INSTANTANEOUS FLUXES AND AVERAGE FLUXES | | | | | |
|---|---|---|---|---|---|---|
| | 1000° C. Csat = 1.54% C | | 950° C. Csat = 1.36% C | | 900° C. Csat = 1.20% C | |
| Time in min. | Flux Mg/h.cm$^2$ | Average flux Mg/h.cm$^2$ | Flux Mg/h.cm$^2$ | Average flux Mg/h.cm$^2$ | Flux Mg/h.cm$^2$ | Average flux Mg/h.cm$^2$ |
| 2.50 | 11.30 | 22.60 | 7.58 | 15.16 | 4.96 | 9.91 |

Csat = Limit of solubility
Initial carbon = 0.1% C

What is claimed is:

1. A process for heat or thermochemical treatment of workpieces of a steel material having an initial composition including an initial value of a surface concentration of carbon, said treatment being effected at a desired temperature and comprising:

placing said workpieces within a heated furnace, causing a gaseous flux including at least one hydrocarbon to circulate within said furnace in contact with surface portions of said workpieces, said flux having a variable composition, and controlling said variable composition during a first phase of said treatment for providing a transfer of carbon from said flux through said surface portions, within said workpieces, wherein said first phase comprises checking said variable composition of said flux and maintaining a constant rate of said at least one hydrocarbon during a time period of less than one minute and subsequently providing an instantaneously diminishing rate of said hydrocarbon, said variable composition being continuously and instantaneously checked to provide firstly an increase of said initial surface concentration value up to a maximal value corresponding to a saturation state of said steel with carbon, said maximal value being obtained within a time period which is the shortest time period compatible with said desired temperature and with said initial composition, said instantaneously diminishing rate being provided when said saturation state is reached and secondly maintaining said surface concentration value at least approximately at said maximal value.

2. The process of claim 1, wherein said constant rate is maintained until a thin layer of cementite one micrometer thick has been formed at the surface of said workpieces.

3. The process of claim 1, wherein said process is used in the course of carbon enrichment of a surface zone of a workpiece.